(12) United States Patent
Ohnakado et al.

(10) Patent No.: US 6,847,511 B2
(45) Date of Patent: Jan. 25, 2005

(54) CIRCUIT PROTECTING AGAINST ELECTROSTATIC DISCHARGE

(75) Inventors: Takahiro Ohnakado, Hyogo (JP); Tatsuo Oomori, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 450 days.

(21) Appl. No.: 10/066,608

(22) Filed: Feb. 6, 2002

(65) Prior Publication Data

US 2003/0008463 A1 Jan. 9, 2003

(30) Foreign Application Priority Data

Jul. 5, 2001 (JP) ..................................... 2001-204397

(51) Int. Cl.⁷ ............................................. H02H 9/00
(52) U.S. Cl. ......................... 361/56; 361/58; 361/111; 361/119
(58) Field of Search ..................... 361/56, 58, 111, 361/113, 119, 127, 18

(56) References Cited

U.S. PATENT DOCUMENTS

| 4,455,586 A | * | 6/1984 | McCartney | ..................... 361/56 |
| 4,930,644 A | * | 6/1990 | Robbins, III | ................. 215/382 |
| 5,416,660 A | * | 5/1995 | Shiga | .......................... 361/111 |

FOREIGN PATENT DOCUMENTS

| JP | 5-110356 | 4/1993 |
| JP | 6-112850 | 4/1994 |
| JP | 11-266529 | 9/1999 |

OTHER PUBLICATIONS

Ker et al.; "Novel Octagonal Device Structure of Output Transistors in Deep–Submicron Low–Voltage CMOS Technology", *IEEE, IEDM*, 96–889, pp. 889–892 (1996).

Groves et al.; "High Q Inductors In a SIGe BiCMOS Process Utilizing a Thick Metal Process Add–on Module", *IEEE BCTM*, 9, 3, pp. 149–152 (1999).

K. Bock; "ESD Issues in Compound Semiconductor High-Frequency Devices and Circuits", *EOS/ESD Symposium*, pp. 1–12, (1997).

* cited by examiner

*Primary Examiner*—Stephen W. Jackson
(74) *Attorney, Agent, or Firm*—Leydig, Voit & Mayer, Ltd.

(57) ABSTRACT

A quarter wavelength transmission line is provided between a signal transmission line for transmitting a high frequency signal and a ground node. The quarter wavelength transmission line has a length equal to a quarter of an effective wavelength of an operation frequency of a semiconductor device. A surge absorbing element is connected between the quarter wavelength transmission line and an internal circuit. The signal transmission line is coupled to the internal circuit through a capacitor. A clamp circuit is provided between a power supply line and a ground line. The clamp circuit clamps the voltage difference between the power supply line and the ground line to a prescribed voltage level or less. A high frequency semiconductor device is thus implemented which is capable of preventing breakdown of an internal circuit element due to an electrostatic discharge phenomenon (ESD) without degrading high frequency characteristics.

16 Claims, 8 Drawing Sheets

CIRCUIT PROTECTING AGAINST ELECTROSTATIC DISCHARGE

BACKGROUND OF THE INVENTION

1. Field of the Invention

The present invention generally relates to a semiconductor device. More particularly, the present invention relates to the structure of a protection circuit for protecting an input/output (I/O) circuit of a high frequency circuit processing a high frequency signal against breakdown due to electrostatic discharge.

2. Description of the Background Art

A discharge phenomenon that occurs between an electrostatically charged object and another object when they contact each other is called ESD (electrostatic discharge). An ESD to a semiconductor device may destroy the semiconductor device. The ESD can be typically modeled into three types: (a) HBM (Human Body Model) modeling discharge from a charged human body to a semiconductor device; (b) MM (Machine Model) modeling discharge from a charged apparatus to a semiconductor device; and (c) CDM (Charge Device Model) modeling discharge of electric charges on a semiconductor device to a grounded object.

FIG. 12 shows exemplary ESD surge current waveforms of CDM and HBM. In FIG. 12, the abscissa indicates time (nanosecond (ns)), and the ordinate indicates a current (ampere (A)). As shown in FIG. 12, in the HBM, charges held by an electrified human body are discharged through a resistance. Therefore, a current stress of about 1 A or so is generated for a relatively long time of about 100 ns. In the CDM, however, charges held by an electrified semiconductor are discharged to a grounded object without passing through a resistance. Therefore, a high current stress of about 10 A or so is applied within a very short time of about 1 ns.

As shown in FIG. 12, when the ESD occurs, a high current is applied to the semiconductor device in a short time. This may possibly cause "thermal breakdown", blowing of an interconnection line or the like by Joule heating. Particularly, when an MIS (Metal Insulator Semiconductor) transistor structure, the mainstream of the recent LSI (Large Scale Integration) silicon (Si) devices, is used, the gate insulation film of the MIS transistor is likely to be dielectrically broken down when a high electric field is applied thereto due to the ESD. The destruction or breakdown of an element due to the ESD is a significant problem.

As an countermeasure against the ESD, various types of ESD protection circuits are generally formed between input/output (I/O) pins and an internal circuit. Here, the I/O pins are hereinafter referred to as input/output (I/O) pads since they are connected to pads on a silicon wafer in the wire bonding step. Such a protection circuit prevents a high voltage surge produced in the ESD phenomenon from being transmitted to the internal circuit, and thus prevents breakdown of a semiconductor element. Such a circuit for preventing a high voltage surge due to the ESD phenomenon from being transmitted to the internal circuit is generally called an ESD protection circuit.

For example, as described by Ker et al. in 1996 IEEE, IEDM96-889, pp. 889–892, a circuit in which a MOS Metal Oxide Semiconductor) transistor held in the OFF state in the normal operation mode is connected to an input/output (I/O) signal line is used as the ESD protection circuit. The normal operation mode herein indicates an operation mode in which a signal having an amplitude of a normal voltage level other than the ESD surge is transmitted.

FIG. 13 shows an example of the structure of a conventional ESD protection circuit. In FIG. 13, the ESD protection circuit includes a P-channel MOS transistor PT (hereinafter, a MIS transistor is described by a generally used MOS transistor) and an N-channel MOS transistor NT. The P-channel MOS transistor PT is connected between a signal transmission line 2 coupled to an I/O pad 1 and a power supply node, and the N-channel MOS transistor NT is connected between the signal transmission line 2 and a ground node.

The P-channel MOS transistor PT has its gate G, source S and back gate BG (N-well: substrate region) connected to the power supply node receiving an external power supply voltage VDD, and its drain D connected to the signal transmission line 2.

The N-channel MOS transistor NT has its gate G, back gate BG (P well: substrate region) and source S connected to the ground node, and its drain D connected to the signal transmission line 2. The signal transmission line 2 couples an internal circuit 3 and the I/O pad 1 to each other to transfer a signal between an outside of the device and the internal circuit 3.

In the normal operation mode, each of the MOS transistors PT and NT is non-conductive with its source S and gate G connected together, forming no current path. Therefore, the MOS transistors PT and NT will not exert an influence on an operation of the internal circuit 3.

As described below, when a ESD surge flows from the I/O pad 1 into the signal transmission line 2, parasitic bipolar transistor operation occurs in the MOS transistor PT or NT, to form a high-current flowing path from the drain D to the source S.

FIG. 14 exemplarily shows the cross-sectional structure of the N-channel MOS transistor NT shown in FIG. 13, and the parasitic bipolar transistor operation thereof. In FIG. 14, the N-channel MOS transistor NT includes a P-well 100 formed in, e.g., a silicon (Si) substrate region, N+ diffusion layers 102, 104 formed at the surface of the P-well 100 and spaced apart from each other, and a gate electrode 106 formed on the region of the P-well 100 between the N+ diffusion layers 102 and 104 with a not-shown gate insulation film interposed in between. The diffusion layers 102, 104 respectively serve as the drain D and the source S, and the P-well 100 serves as the back gate G.

In this N-channel MOS transistor NT, the gate electrode layer 106, the N+ diffusion layer 104 and the P-well 100 are coupled to the ground node. The N+ diffusion layer 102 is connected to the signal transmission line 2.

When a positive high voltage surge is generated, positive charges are supplied to the N+ diffusion layer 102. In response to this positive voltage surge, PN junction between the N+ diffusion layer 102 and the P-well 100 is reverse-biased, resulting in breakdown of the PN junction. As a result, a large current flows from the N+ diffusion layer 102 into the P-well 100. Due to the large current, there arises an impact current (impact ionization) phenomenon in the P-well 100, to generate a large number of electron-hole pairs. Of the electron-hole pairs thus generated, electrons (−) flow into the N+ diffusion layer 102 to which the positive voltage has been applied, whereas holes (+) flow into the ground node through the P-well 100. Assuming that the current produced when the holes flow through the P-well 100 is Ihole and the resistance value of the P-well 100 is Rsub, there is caused a voltage drop of Ihole·Rsub in the depth direction in the P-well 100. This voltage drop raises the potential of a shallow region 108 of the P-well 100 located just below the gate electrode layer 106 to a positive potential. As a result, in an NPN parasitic bipolar transistor formed of the drain N+ diffusion layer 102, the shallow P-well region 108 just below the gate, and the source N+ diffusion layer 104, the drain N+ diffusion layer 102 and the shallow P-well region 108 are reverse-biased, whereas the shallow P-well region 108 and the source N+ diffusion layer 104 are forward-biased. Therefore, this NPN parasitic bipolar transistor is turned ON. In other words, in the N-channel MOS transistor NT being in the OFF state with the gate G thereof grounded, the NPN parasitic bipolar transistor is turned ON in response to the ESD positive voltage surge applied to the drain N+ diffusion layer 102 through the signal transmission line 2. Through current amplifying operation of the NPN parasitic bipolar transistor, the MOS transistor NT can flow a large current from the drain N+ diffusion layer 102 into the ground node through the source N+ diffusion layer 104.

In the P-channel MOS transistor PT, the drain P+ diffusion layer and the back gate N-well are forward-biased in response to the positive voltage surge. Therefore, in the P-channel MOS transistor PT as well, a current due to positive voltage surge flows from the drain diffusion layer to the power supply node through the back gate. Thus, when the positive voltage surge is generated, the parasitic bipolar transistor operation of the N-channel MOS transistor NT and the diode operation resulting from forward-biasing of the PN junction diode of the P-channel MOS transistor PT drive a large current from the signal transmission line 2 to the ground node and the power supply node according to the surge voltage, to enable rapid absorption of the high voltage surge.

FIG. 15 exemplarily shows the cross-sectional structure of the P-channel MOS transistor PT in FIG. 13, and the parasitic bipolar transistor operation thereof upon generation of a negative voltage surge. In FIG. 15, the P-channel MOS transistor PT includes P+ diffusion layers 112, 114 formed at the surface of an N-well 110 and spaced apart from each other, and a gate electrode layer 116 formed on the region of the N-well 110 between the diffusion layers 112 and 114 with a not-shown gate insulation film interposed in between. The gate electrode layer 116, the P+ diffusion layer 114 and the N-well 110 are coupled to the power supply node and receive the power supply voltage VDD. The diffusion layers 112 and 114 respectively serve as the drain D and the source S, and the N-well 110 serves as the back gate. The P+ diffusion layer 112 is connected to the signal transmission line 2.

When a negative voltage surge is generated, PN junction between the drain P+ diffusion layer 112 and the N-well 110 is broken down, to cause an impact current for generating a large amount of electron-hole pairs in the N-well 110. Of the electron-hole pairs thus generated, electrons (–) flow into the power supply node through the N-well 110, whereas holes (+) flow into the drain P+ diffusion layer 112 held at a negative voltage level by the negative voltage surge. Assuming that the resistance of the N-well 110 is represented by Rsubn and the current produced by the electrons (–) is represented by Iele, there is caused a voltage rise of Iele·Rsubn along the depth direction in the N-well 110.

This voltage rise reduces the voltage level of a shallow N-well region 118 just below the gate electrode layer 116. Accordingly, the source P+ diffusion layer 114 and the shallow N-well region 118 are forward-biased, whereas the shallow N-well region 118 and the drain P+ diffusion layer 112 are reverse-biased. As a result, a PNP parasitic bipolar transistor formed of the source P+ diffusion layer 114, shallow N-well region 118, and drain P+ diffusion layer 112 is turned ON. A large current flows from the signal transmission line 2 into the power supply node, whereby the negative voltage surge is absorbed.

At this time, in the N-channel MOS transistor NT as well, the back gate P-well 100 and the drain N+ diffusion layer 102 are forward-biased. Responsively, due to the diode operation, a current flows from the back gate 100 into the drain N+ diffusion layer 102, whereby the negative voltage surge is absorbed.

Accordingly, the ESD protection circuit that uses the MOS transistors held in the OFF state in the normal operation mode as shown in FIG. 13 allows a large current to flow into the ground node and/or the power supply node upon generation of the ESD. Thus, a high current due to the surge can be prevented from flowing into the internal circuit 3, whereby the thermal breakdown and the dielectric breakdown of the gate insulation film can be prevented.

It is well known that, in order that the MOS transistors held in the OFF state in a normal operation provide an excellent ESD protection function, care should be taken of the MOS transistor layout.

FIG. 16 schematically shows the two-dimensional layout of conventional ESD protection MOS transistors. In FIG. 16, source regions SR, gate electrodes G and drain regions DR of the ESD protection MOS transistors are arranged alternately. The source region SR, the gate electrode G and the drain region DR each have a width W made large enough to drive a large current. The source region SR and the drain region DR electrically contact a signal line (signal transmission line or power supply/ground line) through a corresponding contact CT.

In this ESD protection MOS transistor, the contact CT and the gate electrode G must be separated from each other by an adequately large distance, d. According to the aforementioned article of Ker et al, the gate electrode G and the contact CT must be formed with a space d of 5 μm to 6 μm. This is because a drain electric field should be prevented from being increased due to a large surge current, for preventing breakdown of the gate insulation film by hot electrons.

Assuming that the contact CT has a diameter c, the source region SR and the drain region DR each interposed between the gate electrodes G have a width, (2d+c). Accordingly, the MOS transistor used as an ESD protection element must have a sufficiently large distance d between the gate electrode and the contact, and thus each of the source region SR and the drain region DR thereof must have a sufficiently large width Ws. According to the 0.2 μm design rule, the diameter, c, of the contact is generally about 0.2 μm or so. Accordingly, the width Ws of the source region SR and the drain region DR lies in the range from 10.2 to 12.2 μm according to the relation of (2·d+c).

In order to implement a sufficient ESD protection function, the MOS transistor must have a gate width Wg of at least 100 μm because it is required to drive a large current.

Accordingly, as shown in FIG. 17, the source region SR and the drain region DR each have an area of Wg·Ws. According to the 0.2 μm design rule, a source/drain diffusion layer generally has a parasitic capacitance of 1 fF/μm² per unit area. Here, the parasitic capacitance of the source/drain diffusion layer indicates a depletion layer capacitance of PN junction between the drain/source diffusion layer and the well region. Accordingly, when the source region SR and the drain region DR as shown in FIG. 17 are utilized, the MOS transistor used for an ESD protection element has an extremely large parasitic capacitance of 1.02 pF to 1.22 pF formed between the source/drain diffusion layer and the well.

Such an extremely large parasitic capacitance between the well region and the diffusion region of the ESD protection element is not so fatal in a semiconductor memory and a logic circuit device operating at a relatively slow speed.

With recent widespread use of the mobile phones and actual implementation of the wireless LAN (Local Area Network) in practical uses, a high frequency semiconductor device capable of high frequency operation has been increasingly attracting attention, because the high frequency operation is essential to implement high performance and down-sizing and cost-down of electronic equipment used in the mobile phones and the wireless LAN. Conventionally, a III–V group compound semiconductor having high electron mobility such as GaAs is mainly used as a material for implementing the high frequency semiconductor device. However, recent rapid progress in miniaturization of a silicon (Si)-based MOS transistor enables fabrication of a MOS transistor having a fine gate length of 0.2 μm or less. A MOS transistor having such a fine gate length is significantly improved in transconductance Gm and high-frequency characteristics, to implement a MOS transistor having characteristics applicable to a high-frequency device operating in a giga-hertz (GHz) band. Accordingly, the large parasitic capacitance of the ESD protection element is a significant problem against a high frequency device using such a Si-MOS transistor (MOS transistor formed mainly from Si).

FIG. 18 schematically shows an equivalent circuit of the ESD protection element. With respect to the P-channel MOS transistor PT, a parasitic capacitance Cdp and a well resistance Rwn are connected in series between the signal transmission line 2 and the power supply node. With respect to the N-channel MOS transistor NT, a parasitic capacitance Cdn and a well resistance Rwp are connected in series between the signal transmission line 2 and the ground node.

The magnitude, |Z|, of the impedance Z of the capacitance C is generally represented as $1/(2 \cdot \pi \cdot f \cdot C)$, where f is a frequency. Accordingly, as the frequency f increases and a high frequency signal is to be processed, the magnitude, |Z|, of the impedance of the capacitance C is reduced. As the capacitance value C increases, the magnitude, |Z|, of the impedance Z of the capacitance C is further reduced. As shown in FIG. 18, when a high frequency signal HFSG is transmitted through the signal transmission line 2 to which the parasitic capacitances Cdp and Cdn of the drain diffusion layers are connected, the magnitude of the impedance of each of the parasitic capacitances Cdp and Cdn is significantly reduced.

As described in, e.g. 1999 IEEE BCTM 9.3, pp. 149–152, by Groves et al., a low resistance substrate (about 0.01 Ω-cm) is used in a silicon semiconductor device. This is because a material of a high quality is not available for a semi-insulating, high resistance substrate such as that used in a compound semiconductor device formed mainly from a compound semiconductor such as GaAs. Even when a well region is formed on the low resistance substrate, such well has a low resistance, resulting in low well resistances Rwn and Rwp. Accordingly, when the high frequency signal HFSG is transmitted to the signal transmission line 2, components of the high frequency signal HFSG flow through the ESD protection elements due to the small impedance between the signal transmission line 2 and the power supply node and the ground node, resulting in loss of the components of the high frequency signal HFSG through the well resistances Rwn and Rwp.

Thus, a high frequency circuit device that includes an ESD protection element formed of a MOS transistor held in the OFF state in the normal operation mode is large in signal loss, to hinder stable operation of a high frequency semiconductor device (internal circuit 3).

In other words, it is quite difficult to implement a reliable, high-performance, high frequency Si-MOS semiconductor device having high ESD immunity.

For ESD protection, it is conventionally attempt to additionally connect an ESD protection element such as a diode not only in such a silicon (Si)-based semiconductor circuit device but also in a high frequency semiconductor circuit device based on a compound semiconductor such as GaAs. However, in high frequency operation, a parasitic capacitance of the diode element is associated with the signal transmission line, to degrade high frequency characteristics of the semiconductor circuit device. Thus, a reliable high frequency compound semiconductor device having high ESD immunity has not been implemented (see, e.g., Bock et al., 1997 EOS/ESD Symposium, pp. 1–12).

A semiconductor device having low ESD immunity would cause breakdown due to an ESD surge in the step of inspecting and assembling a semiconductor chip after manufacturing the semiconductor device, resulting in a significantly reduced chip yield.

As described above, implementation of a reliable, high performance, high frequency semiconductor device having high ESD immunity is strongly desired not only in a Si-MOS high frequency device but also in a compound semiconductor high frequency element.

SUMMARY OF THE INVENTION

It is an object of the present invention to provide a high frequency semiconductor device capable of improving ESD immunity without degrading high frequency characteristics.

A semiconductor device according to the present invention includes: an internal circuit; a signal transmission line coupled between the internal circuit and a pad, for transmitting a high frequency signal between the pad and the internal circuit; a bypass transmission line connected between a first node of the signal transmission line and a first power supply node, for transmitting at least a signal component that is higher in frequency than the high frequency signal; and a first surge conducting element connected between a second node of the signal transmission line and the first power supply node, for causing a current to flow between the second node and the first power supply node when a voltage at the second node exceeds a prescribed voltage level. The second node is provided between the first node and the internal circuit.

The bypass transmission line is connected between the signal transmission line and the first power supply node, and the first surge conducting element is provided in the subsequent stage. When a high frequency signal transmitted to the signal transmission line is a signal having a frequency of an operation frequency in normal operation of the internal circuit, the bypass transmission line is kept in a high impedance state. Therefore, high frequency components are not bypassed, and the high frequency signal to be transferred is transmitted to the internal circuit through the signal transmission line. When a high voltage surge is transmitted, such high voltage surge is generated through a transient discharge phenomenon and therefore, has a large number of frequency components. Therefore, when a high voltage surge is transmitted the signal transmission line, at least a component other than the frequency components of the target high frequency signal to be transferred is absorbed through the bypass transmission line.

The first surge conducting element in the subsequent stage absorbs the surge voltage components that have not been absorbed through the bypass transmission line. Accordingly, the first surge conducting element in the subsequent stage need not have high current driving capability. As a result, parasitic capacitance in a diffusion layer of the first surge conducting element can be reduced, enabling sufficient increase in magnitude of the impedance to a high frequency signal. Thus, a reliable high frequency semiconductor device capable of reliably absorbing a high voltage surge can be implemented without causing any loss of the normal high frequency signal components.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
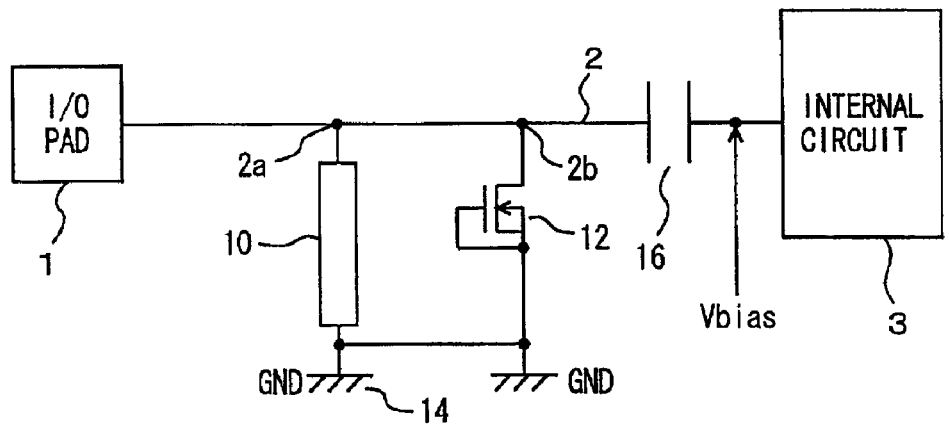
FIG. 1 shows the structure of an ESD protection circuit according to a first embodiment of the present invention.

FIG. 1 shows the structure of an ESD protection circuit according to a first embodiment of the present invention. In FIG. 1, a high-frequency signal input/output (I/O) pad 1 is coupled to a signal transmission line 2. A quarter (¼) wavelength transmission line 10 is connected between a first node 2a of the signal transmission line 2 and a ground node 14. An N-channel MOS transistor-type ESD protection element 12 is connected to a second node 2b of the signal transmission line 2. The ESD protection element 12 has its back gate, gate and first conduction node (source) connected to the ground node 14, and its second conduction node (drain) connected to the second node 2b. The second node 2b is located farther away from the I/O pad 1 and closer to an internal circuit 3, relative to the first node 2a.

The signal transmission line 2 is coupled to the internal circuit 3 through a DC (direct current) cut-off capacitor 16 for cutting off DC components. The DC cut-off capacitor 16 is provided for the following reason. When a DC bias voltage Vbias is superimposed on the high-frequency signal transmitted from the pad 1 for transmission to the internal circuit 3, the DC bias component would flow onto the quarter wavelength transmission line 10 to cause a large current flow through the quarter wavelength transmission line. The DC cut-off capacitor 16 is provided in order to prevent such a large DC current from flowing into the quarter wavelength transmission line 10 due to the DC bias voltage Vbias. Specifically, the DC cut-off capacitor 16 is connected between a node for applying a bias voltage to the internal circuit 3 and the signal transmission line 2.

The gate width of the N-channel MOS transistor of the ESD protection element 12 is set to a value of e.g., 100 μm or less, smaller than that of a conventional protection circuit. The gate width thus reduced would reduce the impedance of a junction capacitance of a diffusion layer of the element 12.

For example, a transmission line such as a microstrip line, a coplanar line, a strip line or a slot line can be used for the quarter wavelength transmission line 10. The quarter wavelength transmission line 10 has a length equal to a quarter of an effective wavelength λ of the operation frequency f of the internal circuit 3. When an interconnection line of the transmission line 10 is high in interconnection layer resistance between the first node 2a and the ground node 14, a large ESD surge current flowing through the interconnection line might blow off the interconnection line by the Joule heat generated in the resistance due to such high current. In order to increase the ESD protection immunity, the quarter wavelength transmission line 10 is preferably formed of a thick aluminum or copper interconnection line in a silicon-based semiconductor device (Si semiconductor device). In a compound semiconductor device, the quarter wavelength transmission line 10 is desirably formed from a low resistance material such as a gold interconnection line.

Increasing the line width of the quarter wavelength transmission line 10 as much as possible is also effective in order to reduce the interconnection line resistance, and is desirable in order to enhance the ESD immunity. However, since the signal transmission line for transmitting a high frequency signal branches out at the first node 2a, impedance mismatch must be prevented from occurring at the first node 2a. Accordingly, regarding the line width and the structure of the quarter wavelength transmission line 10, parameters thereof must be determined so as to satisfy the conditions for implementing impedance matching at the first node 2a.

The lower surface of the semiconductor substrate may be used to form the ground plane of the quarter wavelength transmission line 10. Alternatively, a metal interconnection line in a lower layer of the multilayer interconnection structure may be used to form the ground plane of the quarter wavelength transmission line 10 (in the case where a metal interconnection line in an upper layer thereof is used to form the transmission line).

A capacitor having any structure, such as an MIM (Metal Insulator Metal) capacitor forming a capacitor between metal interconnection layers, can be used for the DC cut-off capacitor 16 for cutting off DC components.

Now, an operation of the ESD protection circuit shown in FIG. 1 will be described.

Figure 2:
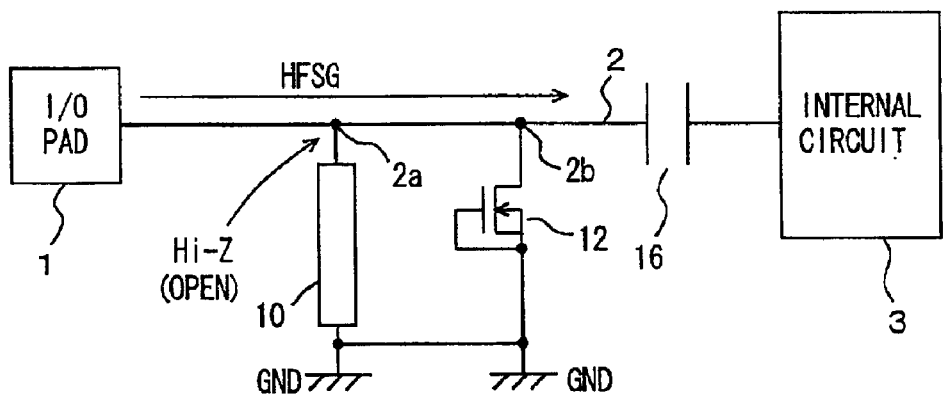
FIG. 2 illustrates an operation of the ESD protection circuit of FIG. 1 in a normal operation mode.

As shown in FIG. 2, in a normal high-frequency operation, the quarter wavelength transmission line 10 having its end grounded is set in a high impedance (Hi-Z: open) state at the connection node (first node) 2a with the signal transmission line 2 for transmitting a high frequency signal. In other words, the quarter wavelength transmission line 10 operates like a stub having its end short-circuited. Therefore, the high frequency signal HFSG will not flow into the quarter wavelength transmission line 10.

Figure 17:
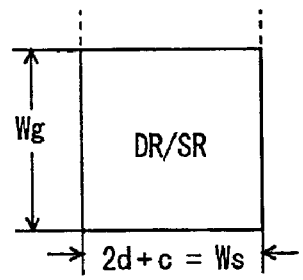
FIG. 17 schematically shows the area of a diffusion layer of a conventional surge protection element.
Figure 18:
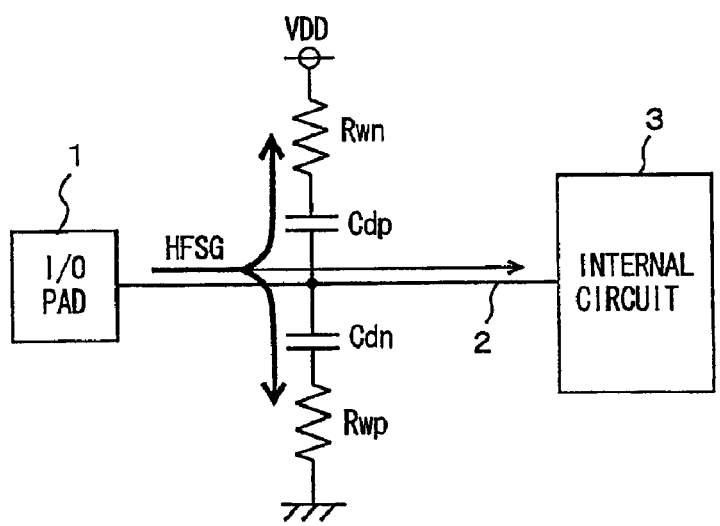
FIG. 18 shows an electric equivalent circuit and a high-frequency signal transmission path of a conventional ESD protection circuit.

The ESD protection element 12 using an N-channel MOS transistor located at the second node 2b in the subsequent stage has a sufficiently small gate width (gate width Wg of FIG. 17), and a small drain parasitic capacitance, causing little signal loss due to the drain parasitic capacitance. Accordingly, if the high-frequency signal HFSG is at the operating frequency, f, of the internal circuit 3, the high frequency signal HFSG is reliably transmitted from the I/O pad 1 to the internal circuit 3 through the signal transmission line 2, whereby high frequency characteristics will hardly change.

The DC cut-off capacitor 16 is merely provided to cut off DC component, and has sufficiently small impedance to the high frequency signal HFSC. Therefore, the high frequency signal HFSG can be reliably transmitted to the internal circuit 3 without causing signal loss.

Figure 3:
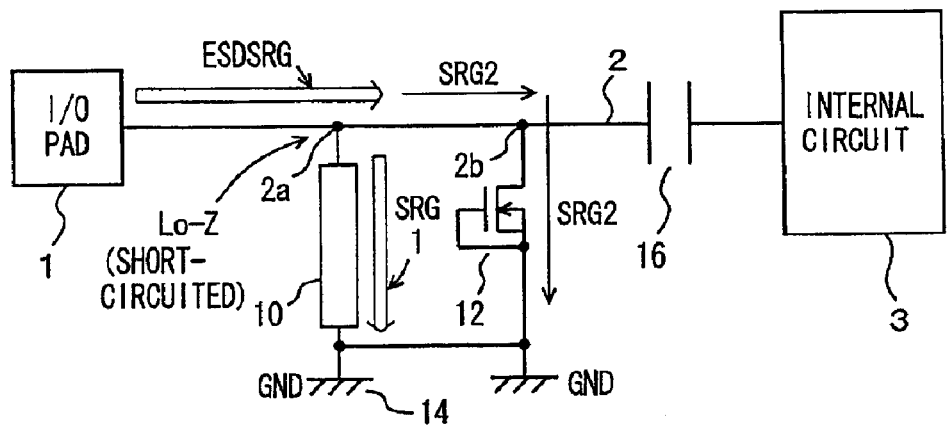
FIG. 3 illustrates an operation of the ESD protection circuit of FIG. 1 upon generation of ESD.

As shown in FIG. 3, if an ESD surge flows into the I/O pad 1, a surge signal is generated on the signal transmission line 2 due to a transient discharge phenomenon. This ESD surge signal ESDSRG has a large number of frequency components due to the transient phenomenon. For the ESD surge signal ESDESRG, the quarter wavelength transmission line 10 behaves as a low impedance interconnection line for the frequency components SRG1 other than the operation frequency, f, of the internal circuit 3, and causes the surge components SRG1, or the frequency components other than the operating frequency f, to flow into the ground node 14.

An approach using such a quarter wavelength transmission line 10 for ESD protection has been proposed as an ESD protection circuit in the fields other than the field of manufacturing a semiconductor chip, that is, as an ESD protection circuit for a microwave unit assembled on a board with modules. When a quarter wavelength transmission line is used as an ESD protection circuit provided outside a semiconductor chip in such microwave technology, an ESD surge can be regarded as a direct current. Therefore, the ESD surge can be discharged into the ground plane by using the quarter wavelength transmission line.

As in the present invention, however, in the case of the ESD protection implemented on a chip of a semiconductor device, mere use of the quarter wavelength transmission line accompanies the following problems: as a model for the ESD breakdown phenomenon, three models are considered as described previously. Unlike the HBM, the CDM (the phenomenon that charges electrifying semiconductor itself are discharged to a grounded conductor) is not a discharge phenomenon through a resistance. Therefore, the discharging occurs in a very short time such as 1 ns. Accordingly, a surge current flowing through the semiconductor has a frequency component on the order of GHz. This surge current is not a direct current (DC current) but a high frequency current. Specifically, unlike the case where a microwave unit is formed with modules as described above, high frequency current components, rather than DC surge current components, are generated in the case of the ESD to the semiconductor chip.

With recent rapid progress in miniaturization and scaling down of the semiconductor devices, an electrified semiconductor device has an increasingly reduced capacitance or the parasitic capacitance of an electrified semiconductor is increasingly reduced, whereby an ESD current based on the CDM has a steeper waveform due to rapid discharging.

Accordingly, in the field of the microwave circuit module, an ESD surge can be regarded as a direct current (DC current) and can be effectively protected by an ESD protection circuit using a quarter wavelength transmission line. However, even if such an ESD protection circuit is directly applied to a circuit within a miniaturized semiconductor chip, complete ESD protection could not be implemented. This is because the ESD surge current appears as high frequency components in a semiconductor device formed on a semiconductor chip.

In view of the foregoing, the surge components other than the components of the operation frequency f are discharged into the ground plane through the quarter wavelength transmission line 10. In addition, the MOS transistor-type ESD protection circuit 12 is provided between the internal circuit 3 and the quarter wavelength transmission line 10. to flow surge components SRG2 having the operation frequency f of the internal circuit 3 out into the ground node.

More specifically, the ESD surge SRG1 other than the operation frequency f of the internal circuit 3 is discharged into the ground plane through the quarter wavelength transmission line 10 utilizing a function of a distributed constant, while the ESD surge SRG2 having the frequency components corresponding to the operation frequency f is discharged through another ESD protection element 12 using a MOS transistor of a concentrated constant element. Thus, the ESD surge ESDSRG can be efficiently discharged reliably.

In particular, the ESD surge SRG2 corresponding to the frequency components of the operation frequency f of the internal circuit 3 amounts to a very small current amount in the total current amount of the ESD surge ESDSRG. Even if the ESD protection circuit 12 is formed of an N-channel MOS transistor having an adequately small gate width, the ESD surge SRG2 corresponding to the operation frequency component can be reliably discharged. As a result, high ESD immunity can be assured for the internal circuit 3.

In other words, the quarter wavelength transmission line 10 is operated as an end shorted stub having its end short-circuited, to implement a function of preventing the frequency components SRG1 of the ESD surge other than the operation frequency f from flowing into the internal circuit 3 without affecting high frequency operating characteristics. Moreover, of the ESD surge components in the CDM, the frequency component of the operation frequency f that is trouble-causing in the semiconductor chip are discharged through the ESD protection element 12, or the concentrated constant element in the subsequent stage. Thus, an ESD-resistant, high frequency semiconductor device with improved characteristics can be implemented.

The quarter wavelength transmission line 10 also behaves as a low impedance interconnection line for a DC signal. Accordingly, if the DC signal flows into the signal transmission line 2, the signal transmission line 2 is short-circuited with the ground plane of the quarter wavelength transmission line 10, to flow a large current. However, provision of the DC cut-off capacitor 16 between the bias input node of the internal circuit 3, to which such a DC signal is applied as a bias voltage, and the internal signal transmission line 2 reliably prevents the transmission of the DC signal onto the signal transmission line 2.

In particular, when the semiconductor device is assembled in a module, a DC cut-off capacitor is normally connected to a module side pin terminal for cutting off DC components to a pin terminal connected to the I/O pad 1 in the outside of the semiconductor chip. Since the DC cut-off capacitor externally connected to the module terminal removes the DC signal components included in the high-frequency signal components transmitted to the I/O pad 1, no DC component will externally flow into the I/O pad 1 through the pin terminal.

Thus, the DC signal can be reliably prevented from flowing into the quarter wavelength transmission line 10. As a result, a DC leak current due to the DC signal can be reliably prevented from being generated on the quarter wavelength transmission line 10.

When the quarter wavelength transmission line with the circuit structure proposed in the conventional module is intactly used for an on-chip ESD protection circuit, such quarter wavelength transmission line is short-circuited DC-wise to cause a disadvantage or trouble. Therefore, such quarter wavelength transmission line cannot be used on the semiconductor chip. However, by providing the DC cut-off capacitor 16 between the ESD protection circuit and the internal circuit 3 and by utilizing both the DC cut-off capacitor connected to the external pin terminal and the internal DC cut-off capacitor 16, short-circuiting of the quarter wavelength transmission line 10 due to the DC current components can be reliably prevented. This allows a semiconductor device having such an ESD protection circuit to be used as a high frequency circuit without degrading the operation characteristics thereof.

Note that, when the semiconductor device has a high operation frequency f, the transmission line may be used as the signal transmission line 2. From the standpoint of impedance matching, a transmission line having characteristic impedance that matches the impedance of the circuitry connected to the I/O pad 1 is used as the signal transmission line 2. The line width and the structure of the quarter wavelength transmission line 10 and the signal transmission line 2 are set so that impedance mismatch will not be increased at the branching point (the first node 2a) of the quarter wavelength transmission line 10.

As has been described above, according to the first embodiment of the present invention, the ESD protection circuit is formed of a so-called end shorted stub having its end short-circuited implemented by the quarter wavelength transmission line and the NMOS transistor-type ESD protection element. The ESD surge can thus be reliably prevented from flowing into the internal circuit without affecting high-frequency operation characteristics of the internal circuit 3. As a result, a highly reliable high frequency semiconductor device having improved characteristics and improved ESD immunity can be implemented.

Second Embodiment

Figure 4:
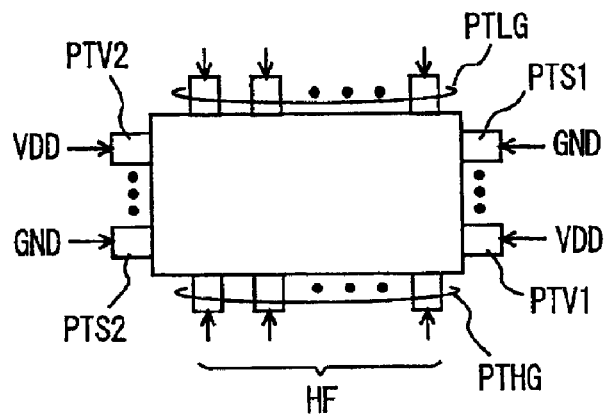
FIG. 4 shows an example of the pin arrangement of a semiconductor device according to the present invention.

FIG. 4 shows an example of a package of a high frequency semiconductor device and pin arrangement thereof. FIG. 4 exemplarily shows a QFD package. Pin terminals are arranged around the rectangular package. The pin terminals include power supply pins PTV1, PTV2 receiving a power supply voltage VDD, ground pins PTS1, PTS2 receiving a ground voltage GND, a pin terminal group PTHG receiving high frequency signals HF, and a pin terminal group PTLG receiving another signal/voltage such as a bias voltage and a control signal. An ESD surge is applied to one of the pin terminals PT of the pin package. Here, PT genericaly refers to the pin terminals. When the ESD surge is applied, another pin terminal serves as the ground plane (surge absorbing destination) for the generated surge. When the ESD surge is applied to any one of the pin terminals of the high frequency signal input/output pin group PTHG, there are the following four cases in terms of the ground plane and the voltage polarity of the applied surge:

(a) an ESD surge of a positive voltage flows into the high frequency signal input/output pad, and the ground pin PTS (PTS1, PTS2) serves as the ground plane;

(b) an ESD surge of a positive voltage flows into the high frequency signal input/output pad, and the power supply pin PTV (PTV1, PTV2) serves as the ground plane;

(c) an ESD surge of a negative voltage flows into the high frequency signal input/output pad, and the ground pin PTS serves as the ground plane; and (d) an ESD surge of a negative voltage flows into the high frequency signal input/output pad, and the power supply pin PTV serves as the ground plane.

Figure 5:
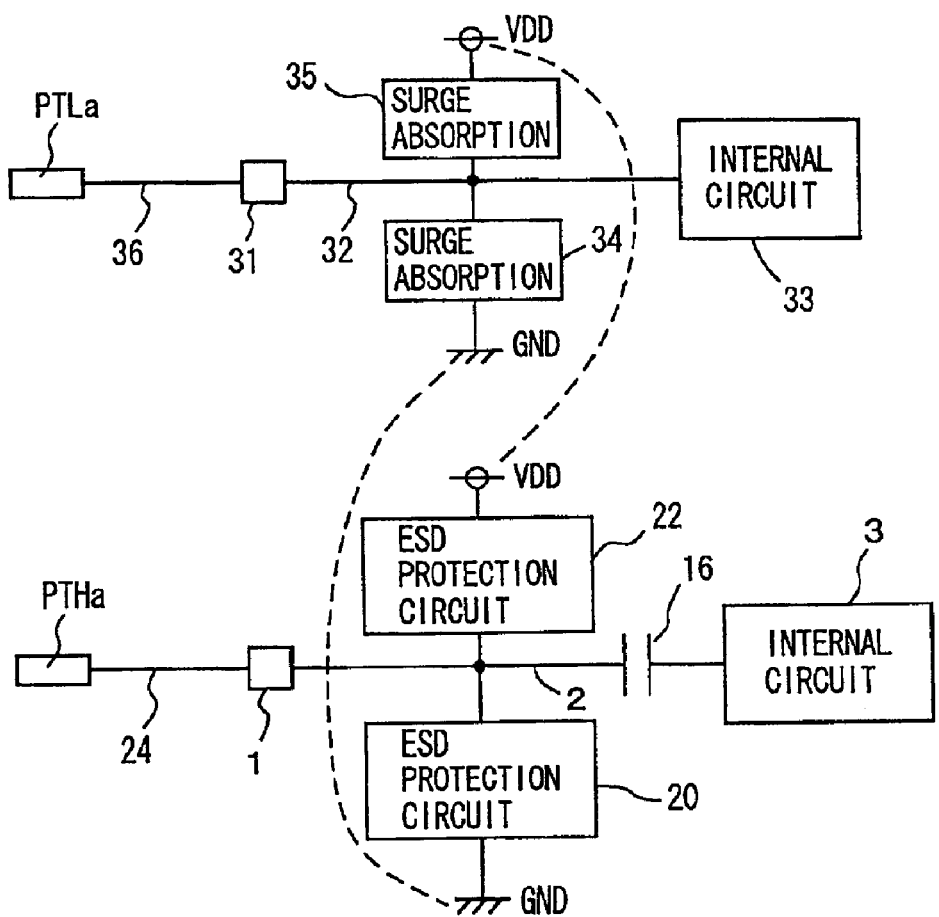
FIG. 5 schematically shows the structure of a main part of a semiconductor device according to the present invention.

In the case where another pin terminal of a pin terminal group PTLG serves as the ground plane, a path for discharging a surge is similarly assured from the another input/output (I/O) pin terminal PTLa to the power supply pin and the ground pin, as shown in FIG. 5.

More specifically, in FIG. 5, the pin terminal PTLa is coupled to a pad 31 through a bonding wire 36. The pad 31 is coupled to an internal circuit 33 through a signal transmission line 32. A surge absorption circuit 35 to the power supply node and a surge absorption circuit 34 to the ground node are coupled to the signal transmission line 32. The pin terminal PTLa is included in another pin terminal group PTLG shown in FIG. 4, and receives a signal different from a high frequency signal.

A pin terminal PTHa for receiving and transmitting a high frequency signal is coupled to a pad 1 through a bonding wire 24. The pad 1 is coupled to a signal transmission line 2, which in turn is coupled to an internal circuit 3 through a DC cut-off capacitor 16. An ESD protection circuit 22 to the power supply node and an ESD protection circuit 20 to the ground node are coupled to the signal transmission line 2. The ESD protection circuit 20 includes a quarter waveform transmission line and an N-channel MOS transistor-type protection element, as described in the first embodiment. The ESD protection circuit 22 also includes an ESD protection element formed of, e.g., a MOS transistor.

As shown in FIG. 5, the power supply node and the ground node for the signal transmission line 32 coupled to the pin terminal PTLa are respectively coupled to the power supply node and the ground node for the signal transmission line 2 coupled to the pin terminal PTHa. Accordingly, when the pin terminal PTLa serves as the ground plane of the ESD surge, the surge absorption circuits 34 and 35 establish a path for sinking out the surge from the pin terminal PTLa into the power supply pin PTV and the ground pin PTS.

When an element such as a field transistor having a field insulation film used as a gate insulation film is used for the surge absorption circuits 34 and 35, the field transistors are rendered conductive when a positive surge voltage is applied to the ground node and when a negative surge voltage is applied to the power supply node. As a result, the surge voltage can be discharged into the pin terminal PTLa. Alternatively, diode element connected in the reverse direction may be used for the surge absorbing circuits 34 and 35. In this case, a positive surge voltage transmitted to the power supply node and a negative surge voltage transmitted to the ground node can be discharged into the pin terminal PTLa through breakdown of the diode elements.

Accordingly, when the another pin terminal PTLa serves as the ground plane of the ESD surge applied to the pin terminal PTHa for a high frequency signal, a surge discharging path from the pin terminal PTHa to the pin terminal PTLa is assured through the power supply pin (power supply node) PTV or the ground pin (ground node) PTS. Accordingly, assuring an ESD surge discharging path in the above four cases makes it possible to form ESD surge discharging paths for all the I/O pins for the high frequency signals.

Figure 6:
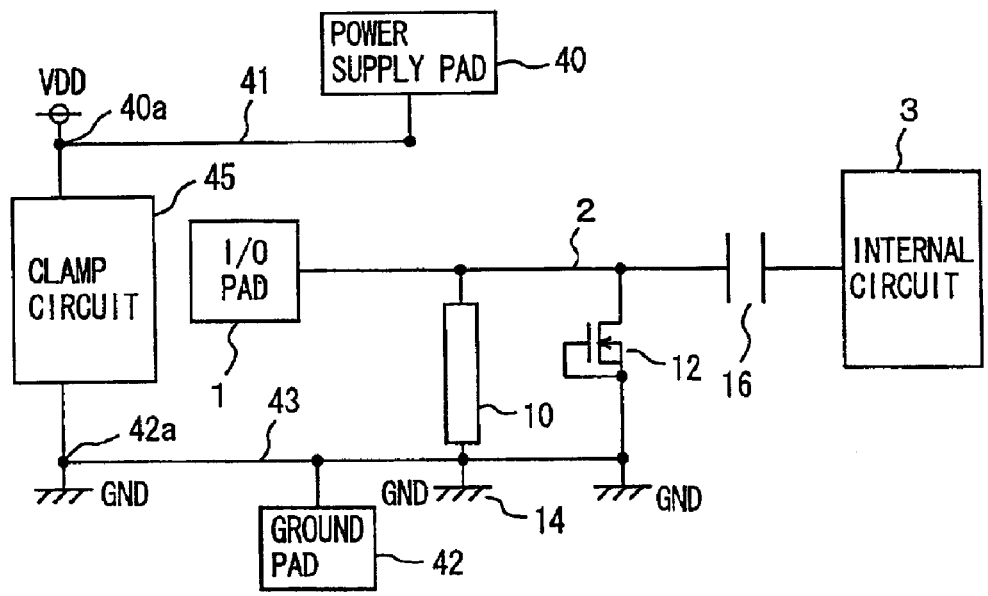
FIG. 6 schematically shows the structure of an ESD protection circuit according to a second embodiment of the present invention.

FIG. 6 schematically shows the structure of an ESD protection circuit according to the second embodiment of the present invention. In FIG. 6, a clamp circuit 45 is provided between a power supply node 40a and a ground node 42a. The clamp circuit 45 operates when the voltage between the power supply node 40a and the ground node 42a exceeds a prescribed value, to clamp the voltage between the power supply node 40a and the ground node 42a to a predetermined voltage level. As to the clamp voltage of the clamp circuit 45, it is merely required that the clamp voltage upon flowing in of a positive voltage current and the clamp voltage upon flowing in of a negative voltage current are both at least a power supply voltage VDD. These clamp voltages do not necessarily have the same value.

The power supply node 40a is coupled to a power supply pad 40 through a power supply line 41. The ground node 42a is coupled to a ground pad 42 through a ground line 43. The ground line 43 is coupled to a quarter wavelength transmission line 10 and an N-channel MOS transistor-type protection element 12 through a ground node 14.

As in the first embodiment, an I/O pad 1 of a high frequency signal is coupled to a signal transmission line 2, which in turn is coupled with the quarter wavelength transmission line 10 and the ESD protection element 12. The signal transmission line 2 is also coupled to an internal circuit 3 through a capacitor 16.

According to the structure of FIG. 6, a surge discharging path for each surge can be assured as described below.

In the case (a), when an ESD surge of a positive voltage flows into the I/O pad 1 and a ground pin serves as the ground plane for the ESD serge, the positive surge voltage is discharged into the ground pad 42. In this case, the positive voltage surge is first discharged into the ground line 43 through the quarter wavelength transmission line 10, and is then discharged through the ground pad 42 into a corresponding ground pin serving as the ground plane.

As in the case (b), the surge is a positive voltage and the ground plane is the power supply pin terminal, the positive voltage surge flowing into the I/O pad 1 is discharged to the ground line 43 through the quarter wavelength transmission line 10. The clamp circuit 45 then operates to transmit the positive surge voltage transmitted to the ground node 42a from the power supply node 40a to the power supply pad 40 through the power supply line 41. The positive voltage surge thus discharged to the power supply pad 40 is discharged into a corresponding power supply pin.

As in the case (c), if the ESD surge is a negative voltage and the ground plane is the ground pin, the negative voltage ESD surge flowing into the I/O pad 1 is discharged into the ground line 43 through the quarter wavelength transmission line 10 and then is discharged to the ground pin terminal serving as the ground plane through the ground pad 42. In this case, the N-channel MOS transistor-type ESD protection element 12 is also rendered conductive to transmit, through diode operation thereof, the negative voltage ESD surge transmitted to the signal transmission line 2 via the ground line 43 and the ground pad 42 to the ground pin serving as the ground plane.

As in the case (d), if the power supply pin terminal is the ground plane for the ESD surge of a negative voltage, the negative voltage ESD surge flowing into the I/O pad 1 is transmitted to the ground line 43 through the quarter wavelength transmission line 10. Then, the clamp circuit 45 operates because the voltage difference between the power supply node 40a and the ground node 42a is increased. Thus, the negative surge transmitted to the negative surge is transmitted to the power supply pad 40 through the power supply line 41 from the power supply node 40a and further transmitted to a corresponding power supply pin.

According to the above arrangement, the clamp circuit 45 is provided between the power supply line 41 and the ground line 43 and is caused to perform clamp operation when the voltage difference between the power supply line 41 and the ground line 43 exceeds a prescribed value. As a result, a path for completely discharging any ESD surge can be reliably established regardless of the voltage polarity and the ground plane for the ESD surge.

More specifically, in the case where the ESD protection circuit using the quarter wavelength transmission line 10 is applied to a semiconductor chip, by ensuring a path for discharging an ESD surge into a power supply pin, an ESD surge with the power supply node being the ground plane can be reliably discharged. Moreover, by adding the clamp circuit 45 to the ESD protection circuit using the quarter wavelength transmission line to assure a path for discharging an ESD surge into a power supply terminal, any ESD surge voltages can be accommodated for, enabling implementation of a high frequency semiconductor device having improved characteristics and improved ESD immunity.

Figure 7:
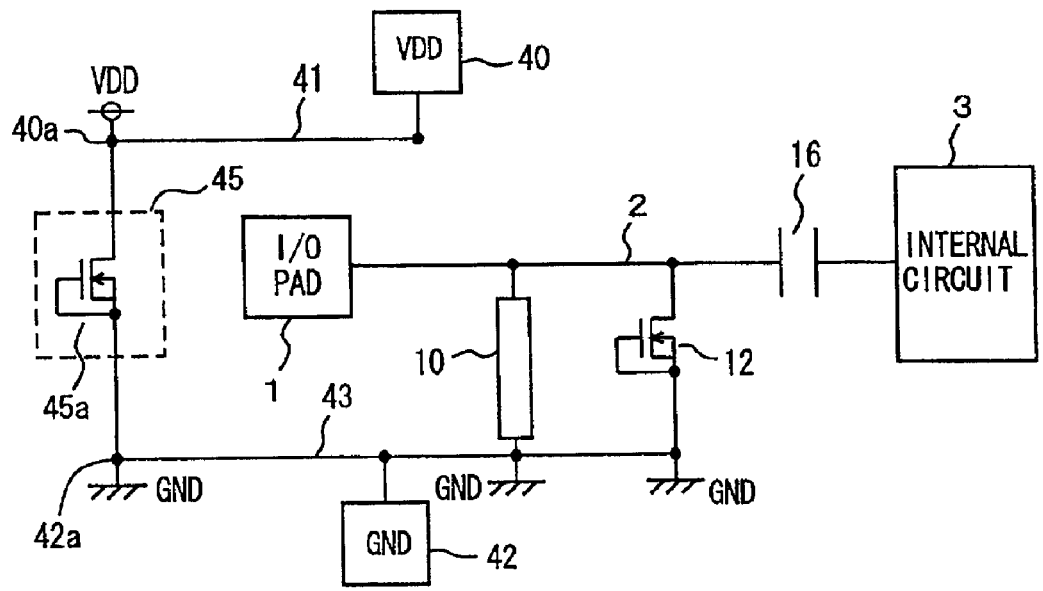
FIG. 7 shows an example of the structure of a clamp circuit in FIG. 6.

FIG. 7 shows an example of the structure of the clamp circuit 45 in FIG. 6. In FIG. 7, the clamp circuit 45 includes an N-channel MOS transistor 45a having its back gate, gate and first conduction node (source) coupled to the ground line 43 through the ground node 42a, and its second conduction node (drain) coupled to the power supply line 41 through the power supply node 40a. When the voltage at the ground node 42a reaches a positive voltage level due to ESD surge of a positive voltage, the PN junction of the diffusion layer of the N-channel MOS transistor 45a is broken down to render a parasitic bipolar transistor thereof conductive, which in turn flows a current between the power supply node 40a and the ground node 42a. On the other hand, when the voltage at the ground node 42a reaches a negative voltage level due to ESD surge of a negative voltage, the PN junction diode of the diffusion layer of the MOS transistor 45a performs a forward operation to flow a current flows between the power supply node 40a and the ground node 42a. Accordingly, due to the parasitic lateral bipolar transistor operation of the MOS transistor 45a or the forward operation of the PN junction diode of the diffusion layer, a current flows between the power supply node 40a and the ground node 42a. As a result, both a negative voltage ESD surge and a positive voltage ESD surge can be absorbed using a power supply pin as the ground plane.

The clamp circuit 45 is connected between the power supply line 41 and the ground line 43, and is not directly connected to the signal transmission line for transmitting a high frequency signal. Accordingly, the clamp circuit 45 will not affect the high frequency characteristics of the signal transmission line for transmitting a high frequency signal. As a result, the ESD immunity can be improved without affecting the high frequency characteristics.

First Modification

Figure 8:
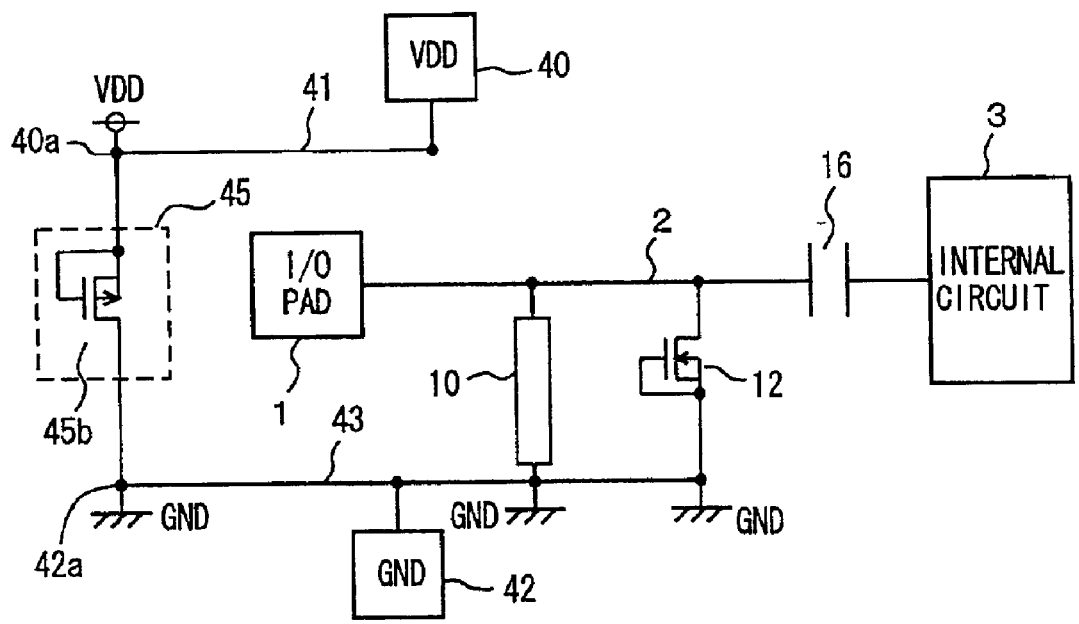
FIG. 8 shows the structure of a first modification of the clamp circuit shown in FIG. 6.

FIG. 8 shows the structure of the first modification of the second embodiment. In FIG. 8, the clamp circuit 45 includes a P-channel MOS transistor 45b having its back gate, gate and first conduction node (source) connected to the power supply node 40a, and its second conduction node (drain) connected to the ground node 42a. The other structure of the ESD protection circuit is the same as that of the first embodiment. The corresponding portions are denoted with the same reference numerals and characters, and detailed description thereof is omitted.

In the clamp circuit 45 shown in FIG. 8, when a ground pin serves as the ground plane, both a positive voltage ESD surge and a negative voltage ESD surge are transmitted to the ground line 43 through the quarter wavelength transmission line 10. The negative voltage ESD surge is also transmitted from the ground line 43 to the ground pad 42 through the N-channel MOS transistor-type ESD protection element 12. Accordingly, as in the above embodiment, when a ground pin terminal serves as the ground plane, any surge voltage can be discharged into the ground pin regardless of its polarity.

When a power supply pin serves as the ground plane and a positive voltage ESD surge is generated, the positive voltage ESD surge is first transmitted to the ground line 43 through the quarter wavelength transmission line 10. In the clamp circuit 45, P channel MOS transistor 45b has the PN junction between the diffusion layer and the well region forward-biased and the positive voltage ESD surge is transmitted to the power supply pad 40 through the power supply line 41 due to the diode operation of the P-channel MOS transistor 45b.

On the other hand, when a negative ESD surge is generated, the negative voltage ESD surge is first transmitted to the ground line 43 through the quarter wavelength transmission path 10. In the clamp circuit 45, a parasitic lateral PNP bipolar transistor is rendered conductive, due to breakdown of the PN junction of the P-channel MOS transistor 45b, to flow the ESD surge current due to the negative voltage ESD surge into the power supply pad 40 through the power supply line 41.

Accordingly, even when the power supply line 41 and the ground line 43 are connected to each other through the P-channel MOS transistor 45b, an ESD surge can be reliably discharged if the power supply pin serves as the ground plane.

In the normal operation, the P-channel MOS transistor 45b receives the same voltage level at its gate and source, and therefore is non-conductive to isolate the power supply line 41 from the ground line 43. The P-channel MOS transistor 45b is merely connected to the power supply line 41 and the ground line 43, and is not connected to the signal transmission line 2 for transmitting a high frequency signal. Therefore, the P-channel MOS transistor 45b will not affect the high frequency signal transmission characteristics.

Second Modification

Figure 9:
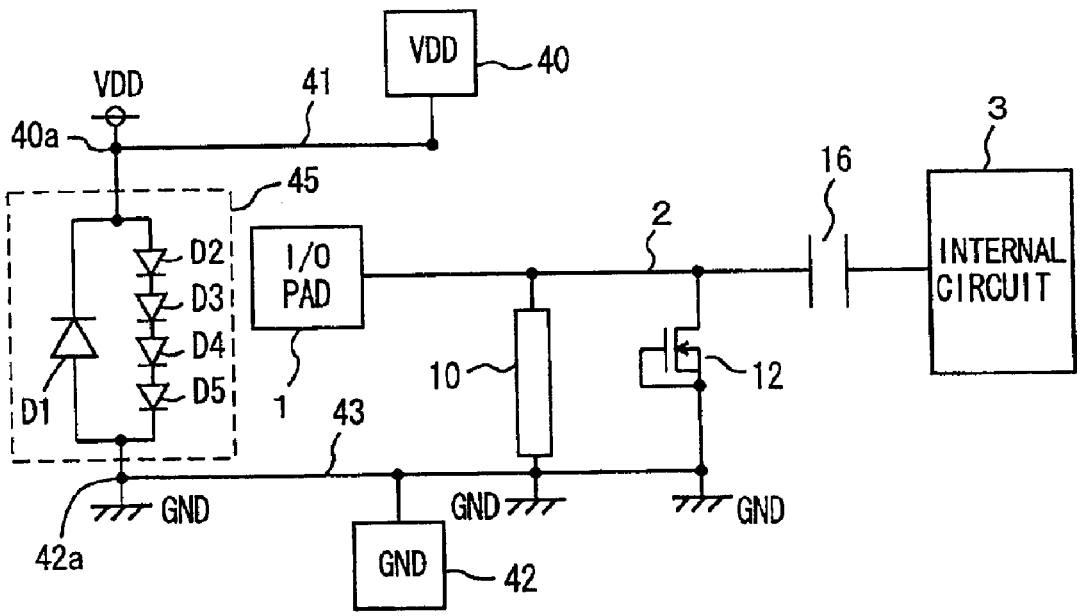
FIG. 9 shows the structure of a second modification of the clamp circuit shown in FIG. 7.

FIG. 9 shows the structure of the second modification of the second embodiment. In FIG. 9, the clamp circuit 45 includes a diode element D1 connected between the ground line 43 and the power supply line 41 in the forward direction viewed from the ground line 43, and a plurality of diode elements D2 to D5 connected in series between the power supply line 41 and the ground line 43 in the forward direction viewed from the ground line 41. The other structure is the same as that shown in FIG. 8. The corresponding portions are denoted with the same reference numerals and characters, and detailed description thereof is omitted.

In the clamp circuit 45 shown in FIG. 9, when a positive voltage ESD surge is transmitted to the ground line 43 and a power supply pin serves as the ground plane, the diode element D1 is rendered conductive, whereby the ESD surge is discharged into the power supply pin through the power supply line 41 and the power supply pad 40.

On the other hand, when a negative voltage ESD surge is transmitted to the ground line 43 and a power supply pin serves as the ground plane, the diode elements D2 to D5 are rendered conductive, whereby the negative voltage ESD surge is similarly discharged into the power supply pin through the power supply line 41 and the power supply pad 40.

The diode elements D2 to D5 are merely required that the total forward voltage drop thereof is equal to or greater than the power supply voltage VDD. Assuming that the forward voltage drop of the diode element D1 is Vbe, the diode element D1 is rendered conductive when a positive voltage ESD surge of the voltage Vbe+VDD is transmitted to the ground line 43. The diode elements D2 to D5 are rendered conductive when a power supply voltage of VDD−4·Vbe is transmitted to the ground line 43. The diode element D1 does not transmit a surge voltage of Vbe+VDD level. However, when a surge voltage on the signal transmission line 2 has the forward voltage drop (Vbe) level above the power supply voltage, no dielectric breakdown occurs in the internal circuit 3. Similarly, the diode elements D2 to D5 do not transmit a surge voltage of VDD−4·Vbe level. However, since this voltage level is close to the ground voltage (GND) level, dielectric breakdown in the internal circuit 3 can be reliably prevented.

Note that the number of diode elements connected in the forward direction between the power supply line 41 and the ground line 43 and the number of diode elements connected in the reverse direction in between may be appropriately selected according to the clamp voltage level of the clamp circuit 45.

The MOS transistors 45a and 45b of the clamp circuit 45 shown in FIGS. 7 and 8 may be used in combination. In other words, the MOS transistors 45a and 45b may be connected in parallel.

When a MOS transistor is used for the clamp circuit, the voltage on the ground line 43 and the signal transmission line 2 may rise to such a level that causes breakdown of the diffusion layer upon generation of a surge. If such high voltage is transmitted to the internal circuit 3, the internal circuit 3 might possibly be destructed. However, by transmitting any of positive and negative surge voltages through the forward diode operation, a voltage applied between the power supply node and the ground node of the internal circuit can be reduced. As a result, the ESD immunity of the internal circuit 3 can be enhanced. The junction breakdown voltage is much higher than the forward voltage drop (junction built-in voltage).

As has been described above, according to the second embodiment of the present invention, a clamp circuit is provided between the power supply line and the ground line. Accordingly, an ESD surge can be reliably discharged even when a power supply pin serves as the ground plane. Thus, any ESD surge in every case can be discharged reliably, achieving implementation of a reliable, high frequency semiconductor device having high ESD immunity.

Third Embodiment

Figure 10:
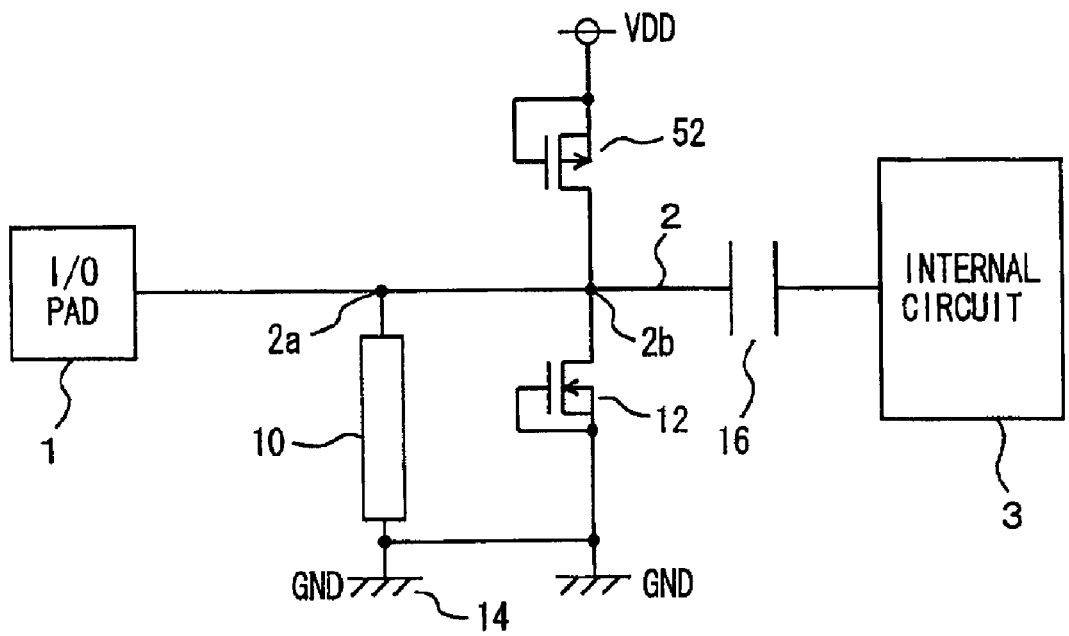
FIG. 10 shows the structure of an ESD protection circuit according to a third embodiment of the present invention.

FIG. 10 schematically shows the structure of an ESD protection circuit according to the third embodiment of the present invention. In addition to the structure of ESD protection circuit according to the third embodiment, the ESD protection circuit shown in FIG. 10 further includes a P-channel MOS transistor 52 connected between the power supply node and the signal transmission line 2. The P-channel MOS transistor 52 has its back gate, control gate and first conduction node (source) coupled to the power supply node, and its second conduction node (drain) coupled to the signal transmission line 2. The P-channel MOS transistor 52 can be connected to the signal transmission line 2 at any node located, at an appropriate position, between the first node 2a and the capacitor 16. In FIG. 10, the MOS transistors 52 and 12 are coupled to the second node 2b in common.

When an ESD surge is generated and flows into the I/O pad 1 of the ESD protection circuit of FIG. 10, the surge component of the operation frequency, f, on the signal transmission line 2 is transmitted to the second node 2b without being absorbed by the quarter wavelength transmission line 10. In the case where a positive voltage surge is transmitted to the node 2a, the ESD surge at the node 2b is discharged into the power supply node through the forward diode operation of the P-channel MOS transistor 52 connected between the power supply node and the signal transmission line 2. On the other hand, in the case of a negative voltage surge, the ESD surge transmitted to the node 2b is discharged into the ground node 14 through the diode operation of the MOS transistor 12.

The MOS transistors 52 and 12 are merely required to discharge only a small amount of surge in the ESD surge that corresponds to the operation frequency, f, of the semiconductor device, and are not required to have large current driving capability. Accordingly, a MOS transistor having a small junction area, that is, a small gate width, can be used for the MOS transistors 12 and 52, and therefore the drain junction capacitance can be reduced. As a result, improved ESD immunity can be implemented while hardly affecting the high frequency characteristics.

The positive voltage surge is discharged into the ground node through the operation of the parasitic lateral bipolar transistor in the MOS transistor-type ESD protection element 12. Similarly, the negative voltage ESD surge is discharged into the power supply node through the operation of the parasitic lateral bipolar transistor in the ESD protection element using the P-channel MOS transistor 52. Thus, the ESD surge components of the frequency, f, transmitted down to the second node 2b can be efficiently discharged.

As has been described above, according to the third embodiment of the present invention, an additional MOS transistor-type ESD protection element is provided between the power supply node and the signal transmission node, so that the ESD surge can be reliably discharged regardless of its polarity.

Fourth Embodiment

Figure 11:
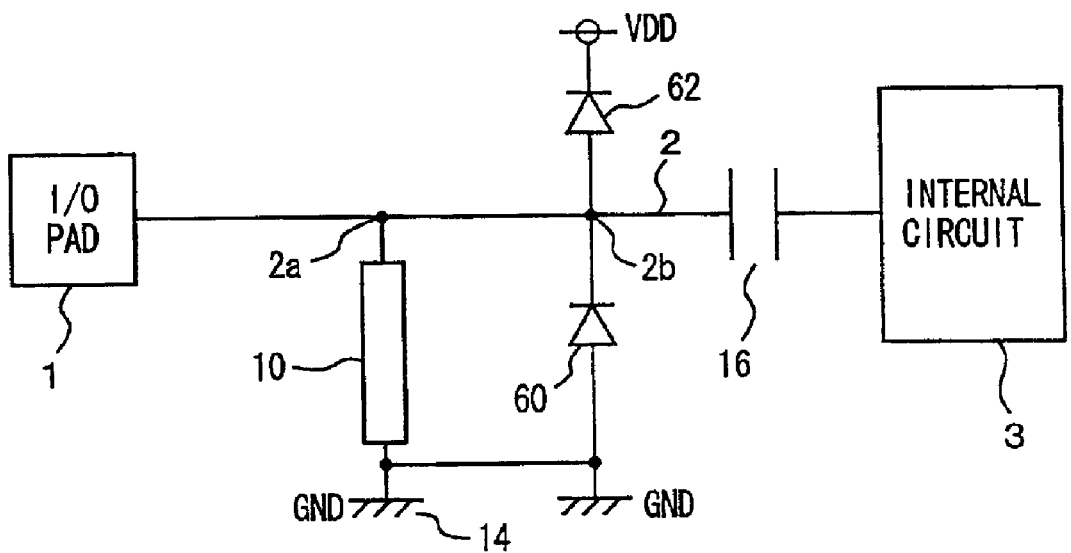
FIG. 11 shows the structure of an ESD protection circuit according to a fourth embodiment of the present invention.
Figure 12:
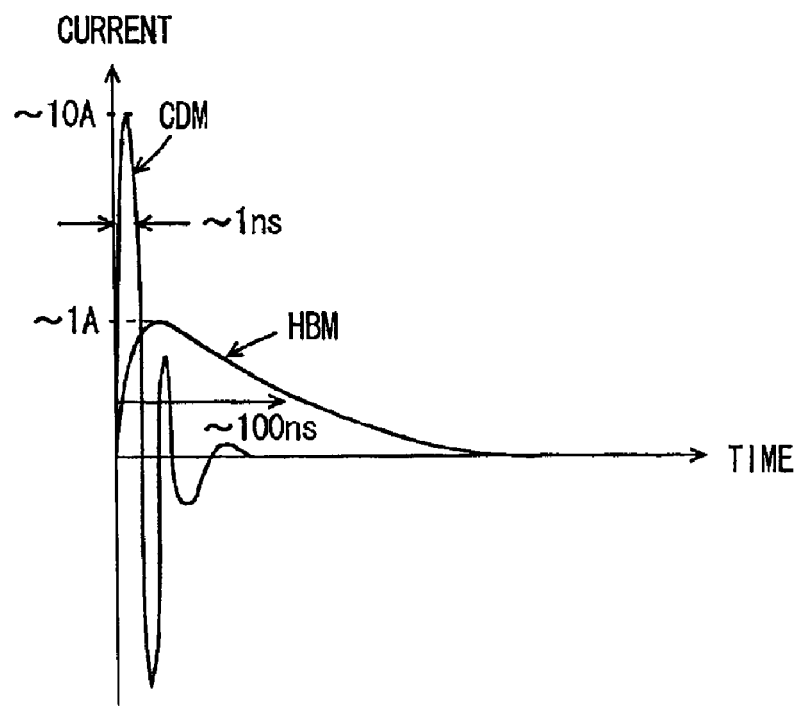
FIG. 12 shows current waveforms of an ESD surge.
Figure 13:
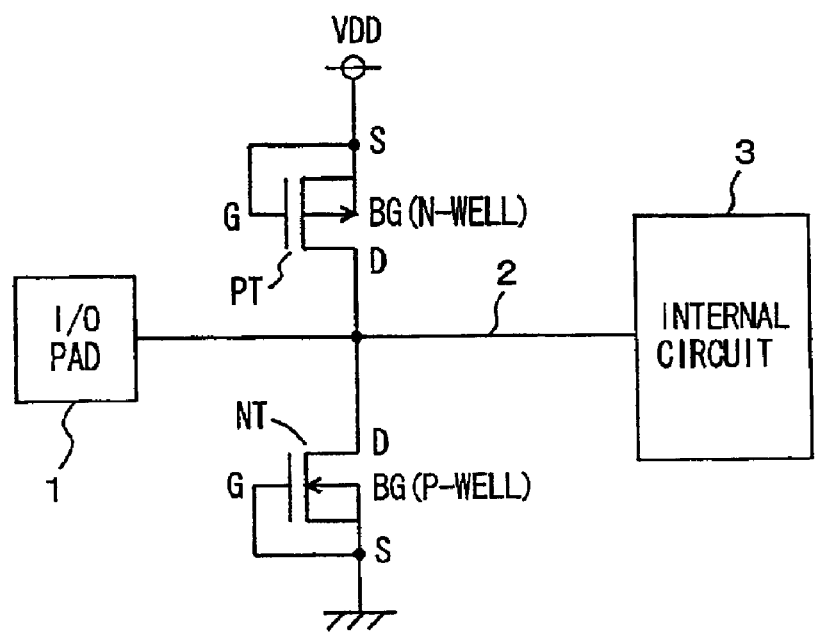
FIG. 13 shows the structure of a conventional ESD protection circuit.
Figure 14:
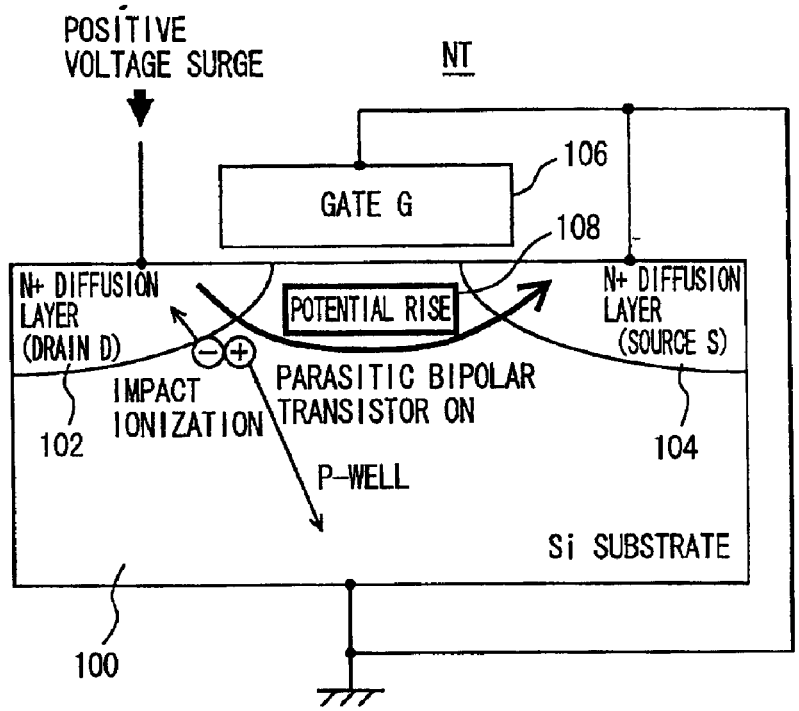
FIG. 14 illustrates surge-absorbing operation of an N-channel MOS transistor in FIG. 13.
Figure 15:
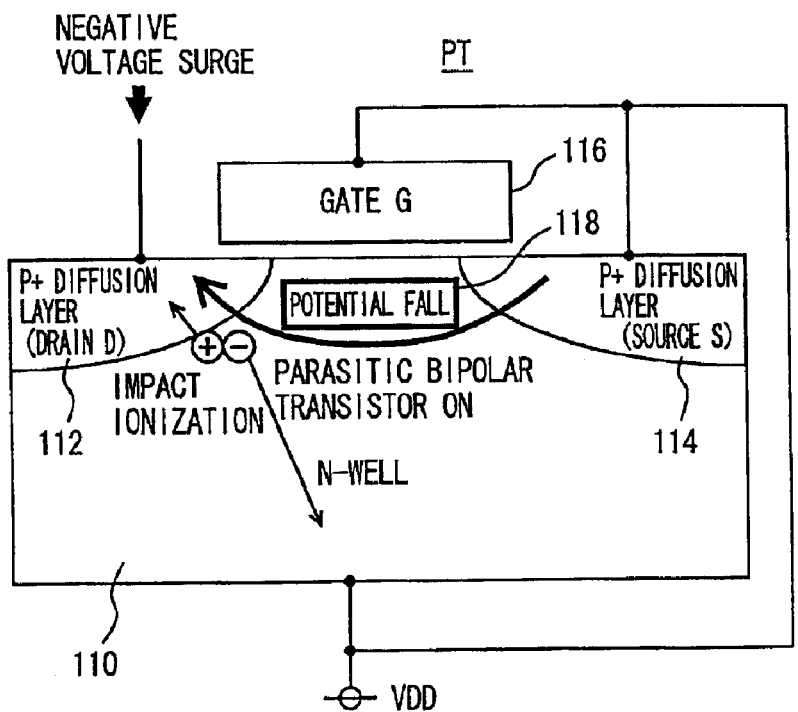
FIG. 15 illustrates surge-absorbing operation of a P-channel MOS transistor in FIG. 13.
Figure 16:
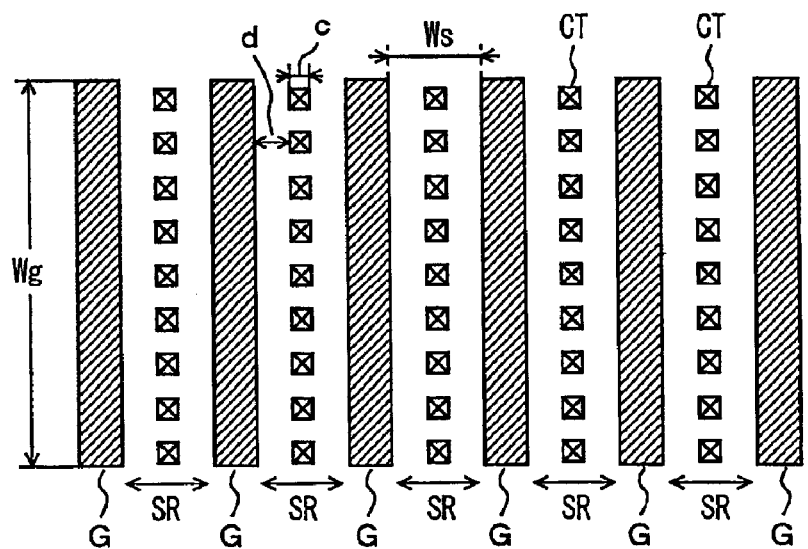
FIG. 16 schematically shows the two-dimensional layout of conventional ESD protection elements.

FIG. 11 shows the structure of an ESD protection circuit according to the fourth embodiment of the present invention. In FIG. 11, the ESD protection circuit includes a diode element 60 connected between a signal transmission line 2 and a ground node 14 in the forward direction viewed from the ground node 14, a diode element 62 connected between the signal transmission line 2 and a power supply node in the forward direction viewed from the signal transmission line 2, a quarter wavelength transmission line 10 connected between the signal transmission line 2 and the ground node 14, and a DC cut-off capacitor 16 connected between the signal transmission line 2 and an internal circuit 3.

For the diode elements 60 and 62, in the case of a silicon semiconductor device, any available diode element such as a diffusion layer diode formed between a diffusion layer and a well region can be used. In the case of a compound semiconductor device as well, any available diode element such as a diode having a diffusion region of different conductivity type formed in a diffusion layer region or a diode formed of a metal gate and a semiconductor region can be used.

In the structure of FIG. 11, ESD surge component having the frequency component equal to the operation frequency, f, is transmitted to a node 2b without being discharged through the quarter wavelength transmission line 10. A positive voltage surge is discharged via the power supply node into the power supply line through the forward operation of the diode 62 connected between the power supply node and the signal transmission line 2. In the case of a negative voltage surge, the diode 60 is forward biased. Therefore, the negative voltage surge can be discharged into the ground node through the diode 60.

The ESD protection diodes 60 and 62 are merely required to discharge only a small amount of surge that corresponds to the operation frequency, f, in the ESD surge. Therefore, the diodes 60 and 62 need not have high current driving capability and a large junction area. In other words, a diode having a sufficiently small junction area can be used for the diodes 60 and 62. Thus, the parasitic capacitance at the junction capacitance of the diode can be significantly reduced to sufficiently increase the impedance against a high frequency signal transmitted through the signal transmission line 2. As a result, an ESD immunity can be improved while hardly affecting the high frequency characteristics adversely.

Other Embodiments

In the above structure, the signal transmission line inputs and outputs a high frequency signal. Therefore, the internal circuit 3 includes an input/output (I/O) buffer circuit. However, the signal transmission line 2 may be a high frequency signal input line. In this case, the internal circuit 3 is formed of an input buffer. Alternatively, the signal transmission line may be an output signal line for outputting a high frequency signal to a pin terminal through a pad. In this case, the internal circuit 10 is formed of an output buffer circuit.

The surge transmission line need not exactly be a quarter wavelength transmission line. The surge transmission line is merely required to discharge most of the surge components so that the MOS transistor-type ESD protection element in the subsequent stage is not required to have a high current driving capability and can be reduced in size.

As has been described above, according to the present invention, a transmission line is connected between a signal transmission line for transmitting a high frequency signal and a first power supply node, and a first surge conducting element is connected between the signal transmission line and the first power supply node. Thus, high frequency components of the ESD surge can be reliably discharged through the transmission line, and surge components that cannot be driven by the transmission line can be discharged through the first surge conducting element at the subsequent stage. As a result, the ESD surge can be prevented from being transmitted to the internal circuit, enabling implementation of a high frequency semiconductor device having high ESD immunity.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A semiconductor device, comprising:
   an internal circuit;
   a pad;
   a signal transmission line coupled between said internal circuit and said pad, for transmitting a high frequency signal between said pad and said internal circuit;
   a bypass transmission line connected between a first node of said signal transmission line and a first power supply node, for transmitting at least a signal component higher in frequency than said high frequency signal; and
   a first surge conducting element connected between a second node of said signal transmission line and said first power supply node, for causing a current to flow between the second node and the first power supply node when a voltage at said first node exceeds a prescribed voltage level, said second node being located between said first node and the internal circuit.

2. The semiconductor device according to claim 1, wherein said first surge conducting element includes a PN junction coupled in a reverse direction, viewed from the second node toward the first power supply node.

3. The semiconductor device according to claim 1, wherein said first surge conducting element includes an insulated-gate field effect transistor having a gate, a first conduction node and a back gate connected together to the first power supply node, and a second conduction node connected to the second node.

4. The semiconductor device according to claim 1, wherein said first surge conducting element includes a diode element connected in a reverse direction viewed from the second node.

5. The semiconductor device according to claim 1, further comprising a second surge conducting element connected between a third node of said signal transmission line and a second power supply node, and rendered conductive when a voltage at the third node exceeds a voltage level applied in a normal operation, the third node being located on said signal transmission line between the first node and said internal circuit.

6. The semiconductor device according to claim 5, wherein said second surge conducting clement includes a PN junction coupled in a reverse direction viewed from the third node toward the second power supply node.

7. The semiconductor device according to claim 5, wherein said second surge conducting element includes an insulated-gate field effect transistor having a gate, a first conduction node and a back gate connected together to the second power supply node, and a second conduction node connected to the third node.

8. The semiconductor device according to claim 5, wherein said second surge conducting element includes a diode element connected to the third node in a reverse direction viewed from the third node.

9. The semiconductor device according to claim 1, further comprising a capacitor connected between the second node and said internal circuit.

10. The semiconductor device according to claim 1, further comprising a clamp circuit connected between the first power supply node and a second power supply node, for holding a voltage difference between the first and second power supply nodes so as not to exceed a prescribed voltage level.

11. The semiconductor device according to claim 10, wherein said clamp circuit clamps the voltage difference between the first and second power supply nodes to a voltage level lower than a breakdown voltage of a diffusion layer of a second conductivity type located on a surface of a substrate region of a first conductivity type.

12. The semiconductor device according to claim 10, wherein said clamp circuit includes an insulated-gate field effect transistor having a gate, a first conduction node and a back gate connected together to the first power supply node, and a second conduction node connected to the second power supply node.

13. The semiconductor device according to claim 10, wherein said clamp circuit includes an insulated-gate field effect transistor having a gate, a back gate and a first conduction node connected together to the second power supply node, and a second conduction node connected to the first power supply node.

14. The semiconductor device according to claim 10, wherein said clamp circuit includes at least one first diode element connected between the first power supply node and the second power supply node in a forward direction viewed from the first power supply node, and at least one second diode element connected between the second power supply node and the first power supply node in a forward direction viewed from the second power supply node.

15. The semiconductor device according to claim 1, wherein the first power supply node is a ground node.

16. The semiconductor device according to claim 1, wherein said bypass transmission line is a quarter wavelength transmission line having a length substantially equal to one quarter of a wavelength at an operation frequency of said internal circuit.

* * * * *